(12) United States Patent
Wu et al.

(10) Patent No.: US 10,439,270 B2
(45) Date of Patent: Oct. 8, 2019

(54) ANTENNA STRUCTURE AND ELECTRONIC DEVICE

(71) Applicant: PEGATRON CORPORATION, Taipei (TW)

(72) Inventors: Chien-Yi Wu, Taipei (TW); Chao-Hsu Wu, Taipei (TW); Shih-Keng Huang, Taipei (TW); Ya-Jyun Li, Taipei (TW); Ching-Hsiang Ko, Taipei (TW); Cheng-Hsiung Wu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 15/972,039

(22) Filed: May 4, 2018

(65) Prior Publication Data

US 2018/0342791 A1  Nov. 29, 2018

(30) Foreign Application Priority Data

May 25, 2017 (TW) .............................. 106117461 A

(51) Int. Cl.
*H01Q 1/36* (2006.01)
*H01Q 1/24* (2006.01)
(Continued)

(52) U.S. Cl.
CPC ........... *H01Q 1/243* (2013.01); *G06F 1/1698* (2013.01); *H01Q 1/2266* (2013.01); *H01Q 1/36* (2013.01);
(Continued)

(58) Field of Classification Search
CPC ...... H01Q 1/243; H01Q 5/314; H01Q 1/2266; H01Q 1/36; H01Q 7/00; H01Q 9/0421;
(Continued)

(56) References Cited

U.S. PATENT DOCUMENTS 5,677,698 A   10/1997 Snowdon et al.
8,325,096 B2  12/2012 Ayala Vazquez et al.
(Continued)

FOREIGN PATENT DOCUMENTS

TW   201521275   6/2015
TW   201703350   1/2017

OTHER PUBLICATIONS

"Office Action of Taiwan Counterpart Application", dated May 22, 2018, p. 1-p. 4.

*Primary Examiner* — Graham P Smith
(74) *Attorney, Agent, or Firm* — J.C. Patents

(57) ABSTRACT

An antenna structure including a metal casing and an antenna assembly is provided. The metal casing has a slit and a slot adjacent to each other. A length of the slit is greater than a length of the slot, and a width of the slit is less than a width of the slot. The antenna assembly is located in the metal casing and near the slit and the slot. An antenna assembly includes a substrate and an antenna pattern. The antenna pattern is disposed on the substrate and encloses a closed zone. The antenna pattern includes a feed end and a ground end to form a first loop and a second loop. Orthographic projections of the antenna pattern and the enclosed closed zone on the metal casing overlap with the slot. The antenna pattern resonates with the slit and the slot to generate a first frequency band and a second frequency band. An electronic device having the antenna structure is further provided.

11 Claims, 5 Drawing Sheets

(51) Int. Cl.

| | |
|---|---|
| *H01Q 13/10* | (2006.01) |
| *H01Q 9/04* | (2006.01) |
| *H01Q 5/314* | (2015.01) |
| *H05K 5/04* | (2006.01) |
| *H01Q 1/22* | (2006.01) |
| *H01Q 7/00* | (2006.01) |
| *H01Q 21/28* | (2006.01) |
| *H01Q 5/371* | (2015.01) |
| *G06F 1/16* | (2006.01) |

(52) U.S. Cl.
CPC ............. *H01Q 5/314* (2015.01); *H01Q 5/371* (2015.01); *H01Q 7/00* (2013.01); *H01Q 9/0421* (2013.01); *H01Q 13/106* (2013.01); *H01Q 21/28* (2013.01); *H05K 5/04* (2013.01)

(58) Field of Classification Search
CPC ........ H01Q 13/106; H01Q 21/28; H05K 5/04; G06F 1/1698
See application file for complete search history.

(56) References Cited

U.S. PATENT DOCUMENTS

| | | |
|---|---|---|
| 8,922,443 B2 | 12/2014 | Zhu et al. |
| 2015/0048982 A1 | 2/2015 | Wang |
| 2017/0005414 A1 | 1/2017 | Yang |

ANTENNA STRUCTURE AND ELECTRONIC DEVICE

CROSS-REFERENCE TO RELATED APPLICATION

This application claims the priority benefit of Taiwan application serial no. 106117461, filed on May 25, 2017. The entirety of the above-mentioned patent application is hereby incorporated by reference herein and made a part of this specification.

BACKGROUND

1. Technology Field

The invention relates to an antenna structure and an electronic device. More particularly, the invention relates to an antenna structure delivering favorable performance and an electronic device including the antenna structure.

2. Description of Related Art

Recently, the metallic material has been adopted by some of the notebook computers to replace the original plastic material and been used to form the housings of the notebook computers, so as to satisfy consumers' demands for appearance design and aesthetics. Nevertheless, it may be difficult for antennas to deliver favorable performance as affected by the shielding effect brought by the metal housings. In addition, most of the antennas of the notebook computers in the market are disposed around the display panels. Nevertheless, the sizes of the external frames of the display panels are less likely to be reduced owing to such allocation.

SUMMARY

The invention provides an antenna structure in which an antenna assembly is located in a metal casing but is still capable of delivering favorable performance.

The invention further provides an electronic device including the antenna structure.

In an embodiment of the invention, an antenna structure includes a metal casing and an antenna assembly. The metal casing has a slit and a slot adjacent to each other. A length of the slit is greater than a length of the slot, and a width of the slit is less than a width of the slot. The antenna assembly is located in the metal casing and near the slit and the slot. The antenna assembly includes a substrate and an antenna pattern. The antenna pattern is disposed on the substrate and encloses a closed zone. The antenna pattern includes a feed end and a ground end to form a first loop and a second loop. Orthographic projections of the antenna pattern and the enclosed closed zone projected on the metal casing overlap the slot. The antenna pattern resonates with the slit and the slot to generate a first frequency band and a second frequency band, respectively.

In an embodiment of the invention, the antenna pattern includes a first radiating unit and a second radiating unit. The first radiating unit and the second radiating unit include a plurality of widths. The first radiating unit includes a first end portion and a second end portion opposite to each other in a length direction and the feed end located between the first end portion and the second end portion. The second radiating unit includes a third end portion and a fourth end portion opposite to each other in the length direction. The first end portion is connected to the third end portion, and the second end portion is connected to the fourth end portion, as such, the closed zone is enclosed.

In an embodiment of the invention, the second radiating unit includes a ground end corresponding to the feed end. The feed end, the first end portion, the third end portion, and the ground end together form the first loop. A bandwidth of the first frequency band is adapted to be adjusted with the widths of the first radiating unit or a length of a path of the first loop.

In an embodiment of the invention, the antenna pattern further includes an extending radiating unit extending from the feed end to the first end portion. The second radiating unit includes a ground end corresponding to the feed end. The feed end, the second end portion, the fourth end portion, and the ground end together form a second loop. Projections of the extending radiating unit and a portion of the antenna pattern forming the second loop on the metal casing overlap with the slot. A bandwidth of the second frequency band is adapted to be adjusted with a length of the extending radiating unit or a length of a path of the second loop.

In an embodiment of the invention, the antenna assembly further includes a ground layer disposed on the substrate and overlapping with a portion of the antenna pattern to conduct the ground end. The ground layer is connected to the metal casing through a conduction member.

In an embodiment of the invention, the antenna assembly further includes a coaxial transmission line. The substrate includes a first surface and a second surface opposite to each other and two conduction vias. The antenna pattern is disposed on the first surface, and the coaxial transmission line is disposed on the second surface. The feed end and the ground end of the antenna pattern are electrically connected to an anode and a cathode of the coaxial transmission line, respectively, through the two conduction vias.

An electronic device provided by an embodiment of the invention includes a first machine body. The first machine body includes a metal upper cover, a metal casing, and two antenna assemblies. The metal upper cover covers the metal casing, and the metal casing includes a bottom wall and two side walls opposite to each other. The two side walls include two slits and two slots. The two slits are individually located the corresponding side walls close to the metal upper cover, and the two slots are individually located the corresponding side walls close to the bottom wall. The slit on each of the side walls is adjacent to the slot. A length of the slit is greater than a length of the slot, and a width of the slit is less than a width of the slot. The two antenna assemblies are individually disposed in the metal casing and near the two slits and the two slots. Each of the antenna assemblies includes a substrate and an antenna pattern. The antenna pattern is disposed on the substrate and encloses a closed zone. The antenna pattern includes a feed end and a ground end to form a first loop and a second loop. Orthographic projections of the antenna pattern and the enclosed closed zone on the metal casing overlap with the slot. The antenna pattern resonates with the slit and the slot to generate a first frequency band and a second frequency band, respectively.

In an embodiment of the invention, the two antenna assemblies further comprise two ground layers individually disposed on the two substrates and overlapping with portions of the two antenna patterns to conduct the two ground ends. The second machine body further includes two conductive members and two metal blocking walls located between the metal casing and the metal upper cover. The two conductive members individually connect the two ground layers of the two antenna assemblies to the bottom wall. The two metal blocking walls are individually located next to the two antenna assemblies and are connected to the metal upper cover and the bottom wall such that the two antenna assemblies are individually located between the two metal blocking walls and the two side walls. Projections of the two metal blocking walls on the two side walls overlap with the two slits and the two slots.

In an embodiment of the invention, the first machine body further includes a wireless communication module disposed in the metal casing. The two antenna assemblies further include two coaxial transmission lines electrically connected to the wireless communication module. In each of the antenna assemblies, the substrate includes a first surface, a second surface, and two conduction vias. The antenna pattern is disposed on the first surface, and the coaxial transmission line is disposed on the second surface. The feed end and the ground end of the antenna pattern are electrically connected to an anode and a cathode of the coaxial transmission line respectively through the two conduction vias.

In an embodiment of the invention, the first machine body further includes two supporting members disposed in the metal casing. Curves of the two supporting members correspond to curves of the two side walls. The two substrates of the two antenna assemblies are two flexible substrates individually attached on the two supporting members. The two antenna patterns face the two side walls.

In an embodiment of the invention, the electronic device further includes a second machine body pivoted to one side of the first machine body to rotate with respect to the first machine body.

To sum up, in the electronic device provided by the embodiments of the invention, the housing of the first machine body is constituted by the metal upper cover and the metal casing. The metal casing includes two slits and two slots disposed at the two side walls. The two antenna assemblies are disposed in portions of the metal casing close to the two sides and near the two slits and slots. The antenna pattern of each of the antenna assemblies respectively encloses the closed zone and includes the feed end and the ground end, such that the first loop and the second loop are formed. Moreover, the Orthographic projections of the antenna pattern and the enclosed closed zone projected on the side wall of the metal casing overlap with the slot and are close to the slit. As such, the antenna pattern may resonate with the slit and the slot to generate the first frequency band and the second frequency band, and favorable performance is thereby achieved. Comparing to the conventional electronic devices, in the electronic device provided by the embodiments of the invention, the appearance of the housing may be made of metal. Moreover, since the antenna structure is disposed at the two sides of the first machine body, the width of the external frame of the display panel on the second machine body may thereby be reduced.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
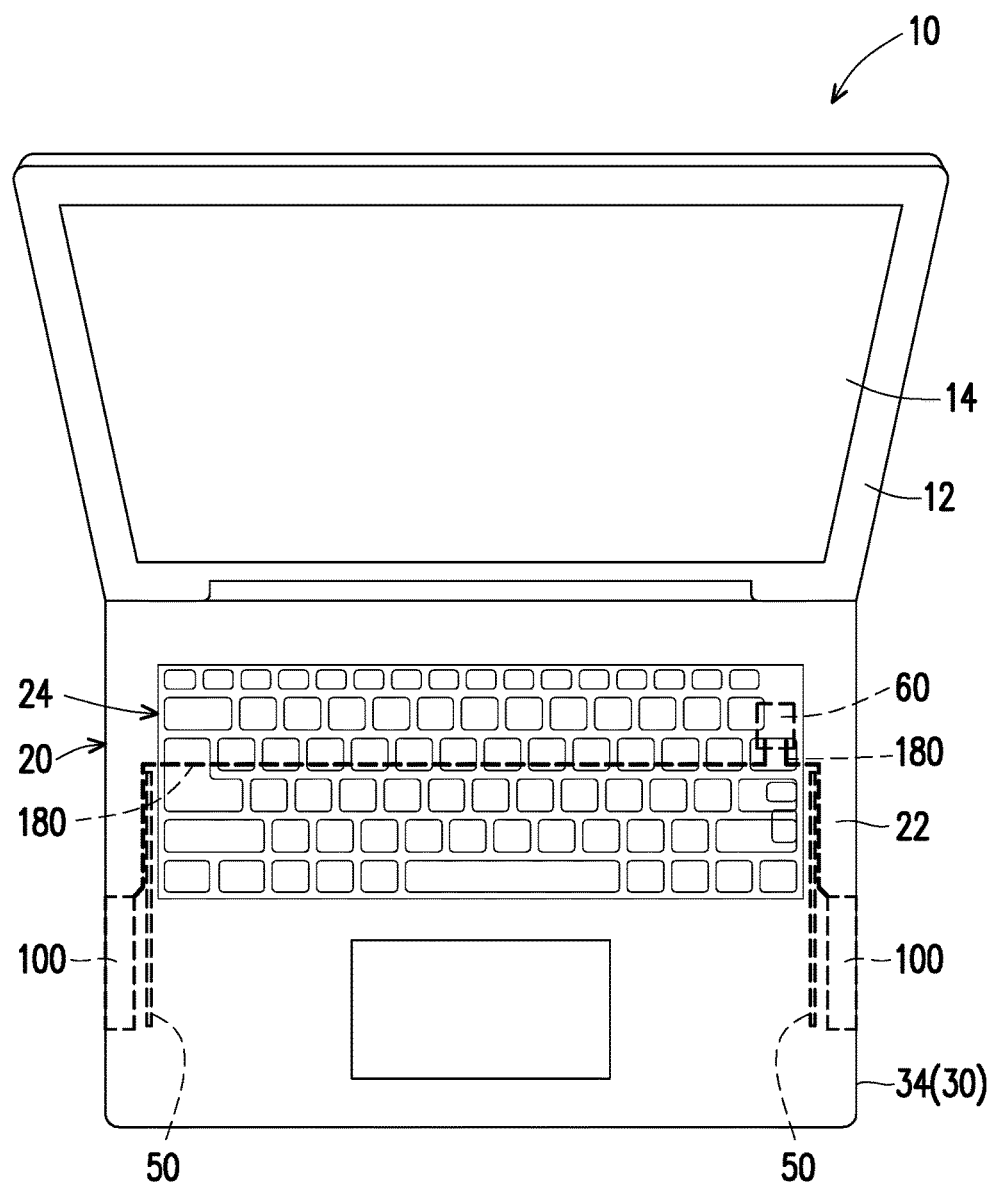
FIG. 1 is a schematic view illustrating an electronic device according to an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a schematic view illustrating an electronic device according to an embodiment of the invention. With reference to FIG. 1, an electronic device 10 of this embodiment includes a first machine body 20 and a second machine body 12. In this embodiment, the electronic device 10 is, for example, a laptop. In other embodiments, the electronic device 10 may be, for example, a tablet computer and includes only the first machine body 20. Nevertheless, types of the electronic device 10 are not limited to the above. The first machine body 20 is a lower machine body, and the second machine body 12 is an upper machine body in this embodiment. The first machine body 20 is pivoted to the second machine body 12. The second machine body 12 includes a display panel 14, and the first machine body 20 includes a keyboard module 24.

The first machine body 20 includes two antenna assemblies 100 and a wireless communication module 60 located inside the first machine body 20 as shown in FIG. 1. The two antenna assemblies 100 are individually disposed at a left side and a right side of the first machine body 20 and are connected to the wireless communication module 60 through two coaxial transmission lines 180 individually. The position of the wireless communication module 60 is closer to the right side in this embodiment. As such, the length of the coaxial transmission line 180 at the right side is shorter, and the length of the coaxial transmission line 180 at the left side is longer. Nevertheless, the relation between the position of the wireless communication module 60 and the lengths of the coaxial transmission lines 180 is not limited to the above. Note that in FIG. 1, the antenna assemblies 100, the coaxial transmission lines 180, metal blocking walls 50, and the wireless communication module 60 are located inside the first machine body 20 and thus are shown by dotted lines.

In this embodiment, a material of housings of the second machine body 12 and the first machine body 20 of the electronic device 10 is, for example, metal, and favorable appearance of the electronic device 10 is provided. Generally, when metal is used to make the housing, an antenna covered by the metal housing is not able to deliver satisfying performance. Nevertheless, in this embodiment, even though the antenna assemblies 100 are located inside the metal housing, performance satisfaction may still be delivered through the special antenna structure design. A detailed description of such design is as follows.

Figure 2:
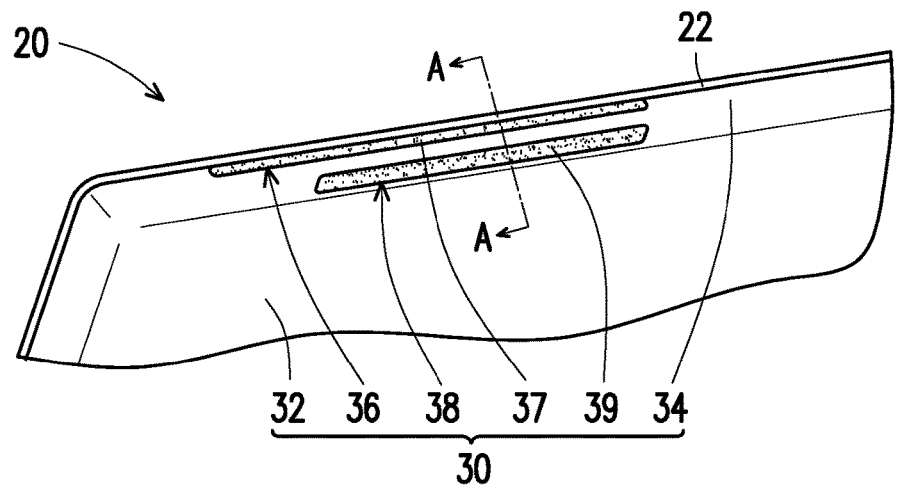
FIG. 2 is a schematic three-dimensional view of a local portion of the first machine body of the electronic device of FIG. 1.
Figure 3:
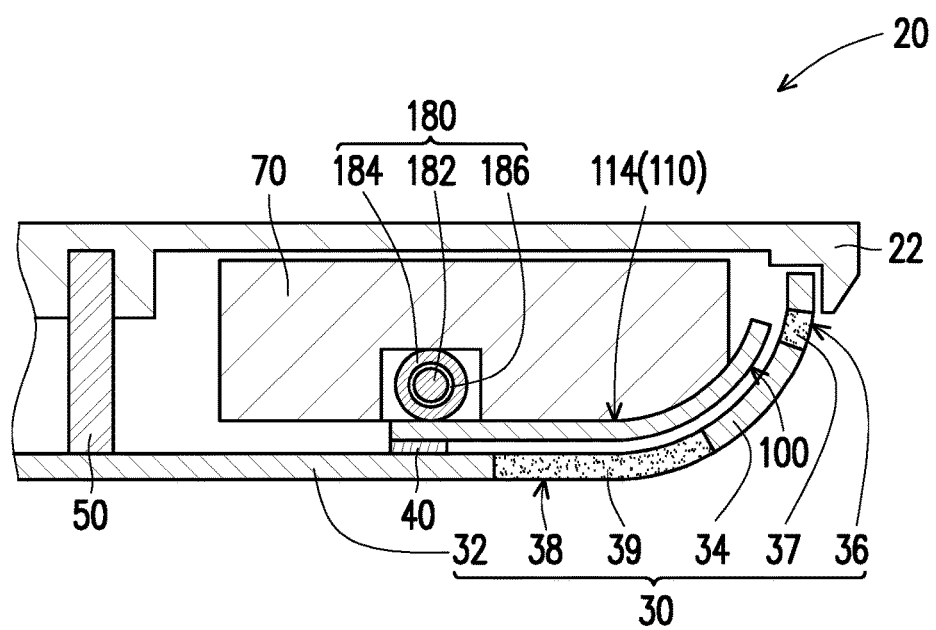
FIG. 3 is a schematic cross-sectional view of a local portion taken along a line A-A of FIG. 2.

FIG. 2 is a schematic three-dimensional view of a local portion of the first machine body 20 of the electronic device 10 of FIG. 1. FIG. 3 is a schematic cross-sectional view of a local portion taken along a line A-A of FIG. 2. Note that FIG. 2 shows a view angle from the bottom right side of FIG. 1. Since a local portion is illustrated, only a portion of a right side wall 34 of the first machine body 20 can be seen from such view angle. Nevertheless, a left side wall 34 opposite to the right side wall 34 of the first machine body 20 is symmetrically disposed with identical allocations.

With reference to FIG. 2 and FIG. 3, in this embodiment, the first machine body 20 includes a metal upper cover 22 and a metal casing 30, and the metal upper cover 22 covers the metal casing 30. The metal casing 30 includes a bottom wall 32 and the side wall 34. The bottom wall 32 is configured to stand on a wall surface of a desk. The side wall 34 includes a slit 36 and a slot 38 adjacent to each other. The slit 36 is located on the side wall 34 close to the metal upper cover 22, and the slot 38 is located on the side wall 34 close to the bottom wall 32. As shown in FIG. 2, the length of the slit 36 is greater than the length of the slot 38, and the width of the slit 36 is less than the width of the slot 38. In this embodiment, the slit 36 and the slot 38 are filled with plastics 37 and 39, respectively, so as to deliver dust-proof effect and protect components inside the metal casing 30. The plastics 37 and 39 may be jointed with the slit 36 and the slot 38, for example, by means of insert molding, but not limited herein. Certainly, in other embodiments, the slit 36 and the slot 38 may not have to be filled with the plastics 37 and 39 or other non-metal objects.

The antenna assembly 100 is disposed in the metal casing 30 and near the slit 36 and the slot 38 as shown in FIG. 3. To be more specific, the orthographic projection of the antenna assembly 100 on the side wall 34 of the metal casing 30 overlaps with the slot 38. In addition, as shown in FIG. 3, the first machine body 20 further includes a supporting member 70 disposed in the metal casing 30. The supporting member 70 may be a housing or a supporting stand of other electronic components. For instance, the supporting member 70 is a supporting stand of a speaker in this embodiment. A curve of the supporting member 70 may correspond to curves of the two side walls 34, and the antenna assembly 100 is flexible and is attached onto the supporting member 70, as such, less space is occupied by the antenna assembly 100. Besides, the supporting member 70 has a cavity corresponding to the coaxial transmission line 180 to accommodate the coaxial transmission line 180, and that a height of the second machine body 30 may be lowered.

Figure 4:
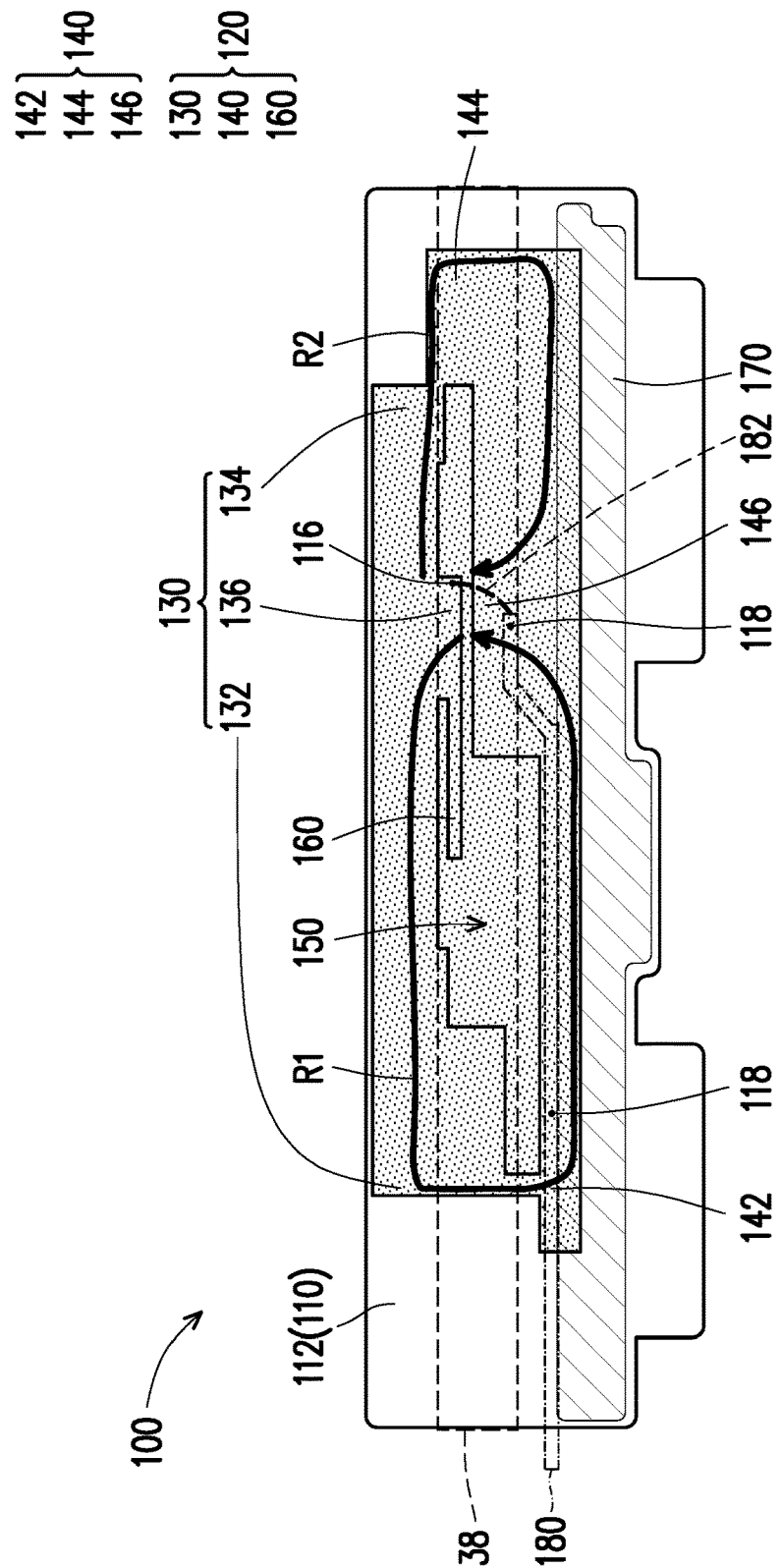
FIG. 4 is a schematic top view of the antenna assembly of the electronic device of FIG. 1.

A detailed structure of the antenna assembly 100 is shown in FIG. 4, and FIG. 4 is a schematic top view of the antenna assembly 100 of the electronic device 10 of FIG. 1. With reference to FIG. 4, the antenna assembly 100 includes a substrate 110 and an antenna pattern 120. The substrate 110 is a double-sided flexible substrate in this embodiment. Nevertheless, types of the substrate 110 are not limited thereto.

The antenna pattern 120 is disposed on the substrate 110 and encloses a closed zone 150 as shown in FIG. 4. More specifically, the antenna pattern 120 is divided into a first radiating unit 130 located at the upper side of FIG. 4 and a second radiating unit 140 located at the lower side of FIG. 4 in this embodiment. The first radiating unit 130 includes a first end portion 132 (left end) and a second end portion 134 (right end) opposite to each other in a length direction (left-right direction) and a feed end 136 located between the first end portion 132 and the second end portion 134. The second radiating unit 140 includes a third end portion 142 (left end) and a fourth end portion 144 (right end) opposite to each other in the length direction (left-right direction) and a ground end 146 corresponding to the feed end 136 and located between the third end portion 142 and the fourth end portion 144. As the first end portion 132 of the first radiating unit 130 is connected to the third end portion 142 of the second radiating unit 140, and the second end portion 134 of the first radiating unit 130 is connected to the fourth end portion 144 of the second radiating unit 140, the closed zone 150 is enclosed and formed.

As shown by the bold lines in FIG. 4, in this embodiment, this antenna pattern 120 is disposed in a manner in which a first loop R1 is formed by the feed end 136, the first end portion 132, the third end portion 142, and the ground end 146 together, and a second loop R2 is formed by the feed end 136, the second end portion 134, the fourth end portion 144, and the ground end 146 together.

In addition, the substrate 110 includes a first surface 112 (shown in FIG. 4) and a second surface 114 (shown in FIG. 3) opposite to each other in this embodiment. The antenna pattern 120 is disposed on the first surface 112. Since the second surface 114 of the substrate 110 of the antenna assembly 100 is attached to the supporting member 70, the first surface 112 of the substrate 110 of the antenna assembly 100 faces the side wall 34, and further the antenna pattern 120 located on the first surface 112 faces the slot 38 of the side wall 34. A corresponding position of the slot 38 is shown by dotted lines in FIG. 4. It can be seen that the slot 38 overlaps with a portion of the antenna pattern 120 and the closed zone 150 enclosed by the antenna pattern 120.

In this embodiment, owing to the shape of the antenna pattern 120 and allocation of the positions among the antenna pattern 120, the slit 36, and the slot 38, the antenna pattern 120 resonates with the slit 36 and the slot 38 to generate a first frequency band and a second frequency band, respectively. To be more specific, the area of the antenna pattern 120 resonates with the slit 36 to generate the first frequency band, and the closed zone 150 enclosed by the antenna pattern 120 resonates with the slot 38 to generate the second frequency band. In this embodiment, the first frequency band is, for example, WiFi 2.4G with a corresponding frequency of 2400 MHz to 2500 MHz, and the second frequency band is, for example, WiFi 5G with a corresponding frequency of 5150 MHz to 5875 MHz. Nevertheless, the frequencies of the first frequency band and the second frequency band are not limited to the above.

Note that, in this embodiment, a frequency point position or a bandwidth of the first frequency band may be adjusted with a width of the first radiating unit 130 or a length of a path of the first loop R1. In addition, in this embodiment, the antenna pattern 120 further includes an extending radiating unit 160 extending from the feed end 136 towards the first end portion 132. A frequency point position or a bandwidth of the second frequency band may be adjusted with a length of the extending radiating unit 160 or a length of a path of the second loop R2.

In FIG. 4, each of the first radiating unit 130 and the second radiating unit 140 includes a plurality of widths in this embodiment. To be more specific, a width of the first end portion 132 is greater than a width of the second end portion 134, and a width of the third end portion 142 is less than a width of the fourth end portion 144. Certainly, the relations of the widths of the first radiating unit 130 and the second radiating units 140 are not limited to the above. The widths and the lengths of the first radiating unit 130 and the second radiating unit 140 may be adjusted by the designer, if required, so as to adjust the frequency point positions or the bandwidths of the first frequency band and the second frequency band generated by the resonance of the slit 36 and slot 38.

In addition, the antenna assembly 100 further includes a ground layer 170 in this embodiment. A material of the ground layer 170 is but not limited to, for example, copper. The ground layer 170 is disposed on the substrate 110 and overlaps with a portion of the antenna pattern 120. To be more specific, the ground layer 170 conducts the ground end 146 of the antenna pattern 120 and overlaps with a portion of the second radiating unit 140 of the antenna pattern 120, which is distant from the first radiating unit.

As shown in FIG. 3, the antenna assembly 100 further includes the coaxial transmission line 180 disposed on the second surface 114 for transmitting an antenna signal to the wireless communication module 60 (shown in FIG. 1). The coaxial transmission line 180 includes a signal line 182 located at an inner layer, a ground line 184 located at an external layer, and an insulating layer 186 separating the signal line 182 from the ground line 184.

The coaxial transmission line 180 is disposed on the second surface 114 and thus is shown by dotted lines in FIG. 4. As shown in FIG. 4, the coaxial transmission line 180 is located on the second surface 114 of the substrate 110 and extends from a position corresponding to the third end portion 142 of the second radiating unit 140 to a position corresponding to the ground end 146. Moreover, the signal line 182 of the coaxial transmission line 180 further extends to a position corresponding to the feed end 136. In this embodiment, the substrate 110 has one conduction via 116 and two conduction vias 118. The conduction via 116 is connected to the feed end 136 and the signal line 182 (i.e., connected to an anode) of the coaxial transmission line 180. One of the two conduction vias 118 is connected to the ground end 146 and the ground line 184 (i.e., connected to a cathode, shown in FIG. 3) of the coaxial transmission line 180 while the other conduction via 118 is connected to the second radiating unit 140 and the ground line 184 (connected to the cathode, shown in FIG. 3) of the coaxial transmission line 180. In other words, the feed end 136 of the antenna pattern 120 is electrically connected to the anode of the coaxial transmission line 180 through the conduction via 116. The ground end 146 of the second radiating unit 140 of the antenna pattern 120 and a portion of the second radiating unit 140 close to the portion covered by the ground layer 170 are electrically connected to the cathode of the coaxial transmission line 180 together through the conduction vias 118.

Certainly, in other embodiments, the substrate 110 may have only one conduction via 116 and one conduction via 118. The feed end 136 and the ground end 146 of the antenna pattern 120 are electrically connected to the signal line 182 (i.e., the anode) and the ground line 184 (i.e., the cathode) of the coaxial transmission line 180 through the two conduction vias 116 and 118, respectively. Numbers of the conduction vias 116 and 118 are not limited to the above.

With reference to FIG. 3 again, the first machine body 20 further includes a conductive member 40 and a metal blocking wall 50 located between the metal casing 30 and the metal upper cover 22. To be specific, the conductive member 40 connects the ground layer 170 (shown in FIG. 4) of the antenna assembly 100 to the bottom wall 32. In this embodiment, the conductive member 40 is conductive fabrics or conductive foam, for example. Nevertheless, types of the conductive member 40 are not limited to the above. The metal blocking wall 50 is located next to the antenna assembly 100 and is connected to the metal upper cover 22 and the bottom wall 32. That is, a ground signal of the antenna assembly 100 is transmitted to the bottom wall 32 through the conductive member 40 and is transmitted to the metal upper cover 22 through the metal blocking wall 50. The bottom wall 32 with a large area and the metal upper cover 22 work as a ground surface together, and thereby the stability of system ground of the antenna assembly 100 is enhanced.

In addition, as shown in FIG. 3, the antenna assembly 100 is located between the metal blocking wall 50 and the side wall 34, and the projection of the metal blocking wall 50 on the side wall 34 overlaps with the slit 36 and the slot 38. Besides, as shown in FIG. 1, a motherboard (not shown) is located at the center of the first machine body 20, and the metal blocking wall 50 is located between the motherboard and the antenna assembly 110 for blocking interference generated by a noise of the motherboard to the antenna assembly 100. Further, in this embodiment, the metal blocking wall 50 work as a 1.5 wavelength cavity resonance structure of the second frequency band (i.e., WiFi 5G) through such allocation, and thereby the antenna performance can be improved.

In this embodiment, the antenna assembly 100 is disposed at the first machine body 20 (the lower machine body) rather than the second machine body 12 (the upper machine body), and therefore the width of an external frame of the display panel 14 on the second machine body 12 (the upper machine body) provided by this embodiment may be reduced by a manufacturer. In addition, since the antenna assembly 100 is flexible, thin, and small-sized the antenna assembly 100 can be flexibly attached to the surface of the supporting member 70 or the electronic component and does not take up too much space even if the antenna assembly is designed to locate at the first machine body 20. Therefore, the antenna assembly 100 may be applied onto an ultra-thin laptop computer with the first machine body 20 of only 5.9 mm thick. Besides, the slit 36 and the slot 38 are located at the side wall 34 of the first machine body 20 so no additional slot or slit is required to be disposed on the metal upper cover 22 of the first machine body 20 for the antenna assembly 100. As such, the metal casing 30 gives a user the same feeling when the user is typing and places his/her hand on the metal upper cover 22. As shown in FIG. 3, the side wall 34 of the metal casing 30 is inclined downwards, it is not easy for a user to perceive the slit 36 and the slot 38 from above, and that the appearance remains intact.

Figure 5:
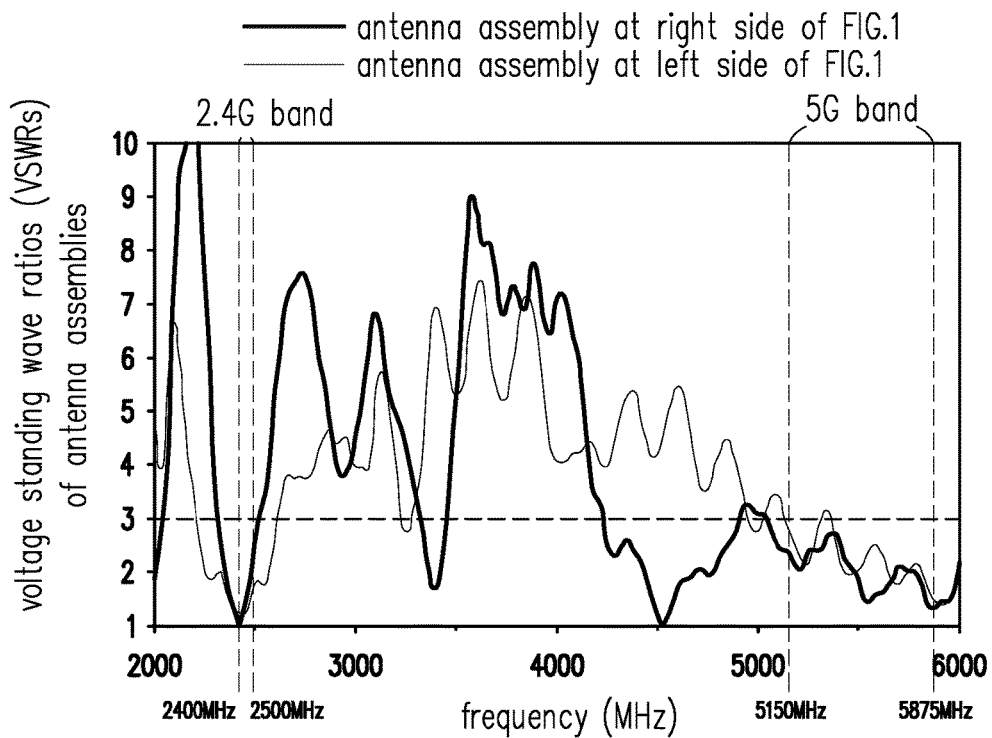
FIG. 5 is a graph of relations between frequencies and voltage standing wave ratios of the antenna structure of the electronic device of FIG. 1.

Performances of the antenna structure of the electronic device of FIG. 1 in practical tests are described as follows. FIG. 5 illustrates the relations between frequencies and voltage standing wave ratios (VSWRs) of the antenna structure of the electronic device of FIG. 1. With reference to FIG. 5, VSWRs of the two antenna assemblies 100 on the right side and the left side of FIG. 1 are less than 3 within the first frequency band (WiFi 2.4G, with a corresponding frequency of 2400 MHz to 2500 MHz) and the second frequency band (WiFi 5G, with a corresponding frequency of 5150 MHz to 5875 MHz) mostly, and favorable performance is recorded.

Figure 6:
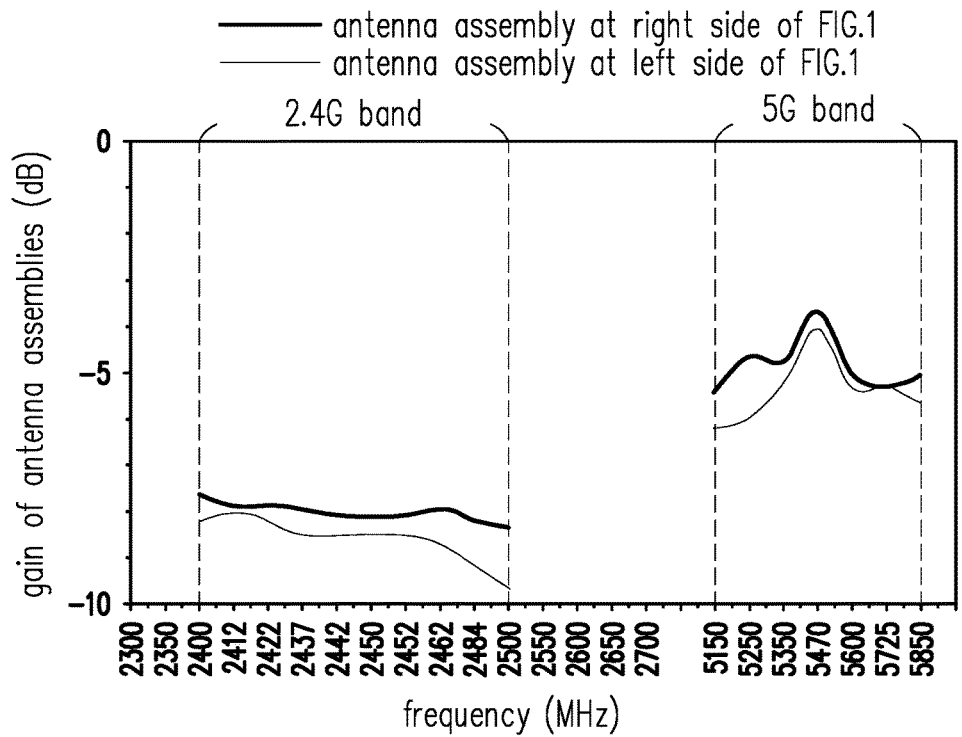
FIG. 6 is a graph of relations between frequencies and antenna efficiencies of the antenna structure of the electronic device of FIG. 1.

FIG. 6 illustrates the relations between frequencies and antenna gains of the antenna structure of the electronic device of FIG. 1. With reference to FIG. 6, the antenna gain of the two antenna assemblies 100 on the right side and left side of FIG. 1 ranges from −7.5 dB to −8.5 dB within the first frequency band (WiFi 2.4G, with the corresponding frequency of 2400 MHz to 2500 MHz), and the antenna gain of the two antenna assemblies 100 on the right side and left side of FIG. 1 ranges from −4 dB to −6 dB within the second frequency band (WiFi 5G, with the corresponding frequency of 5150 MHz to 5875 MHz), both delivering favorable antenna frequencies.

Figure 7:
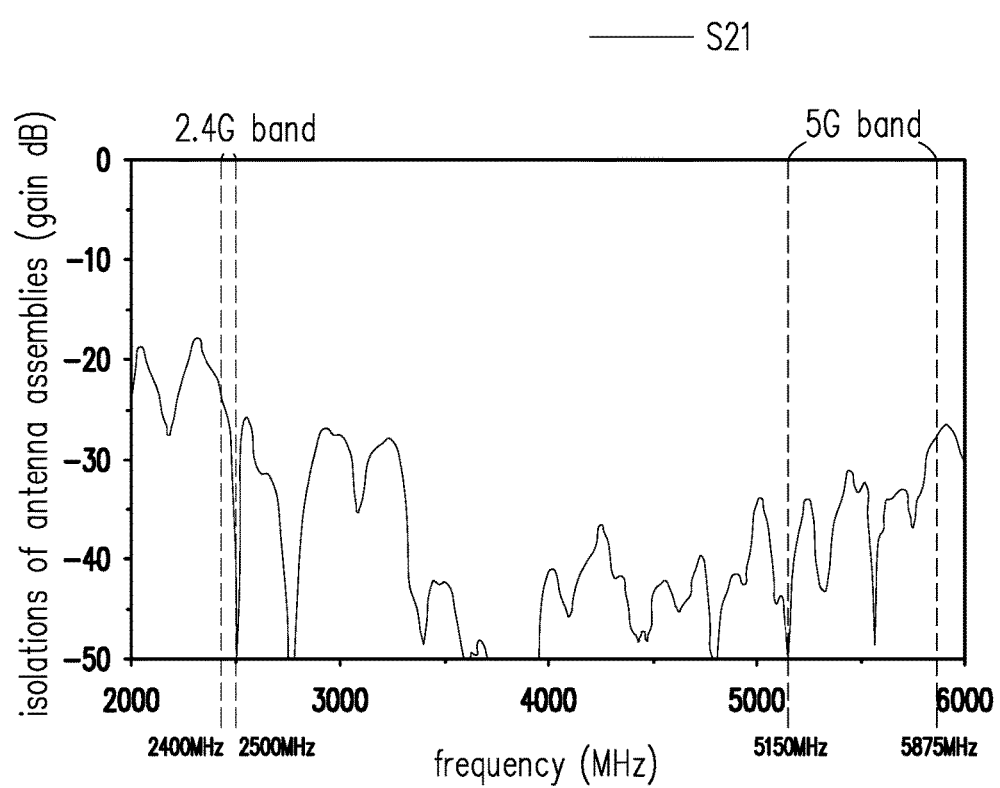
FIG. 7 is a graph of relations between the frequencies and isolations of the antenna structure of the electronic device of FIG. 1.

FIG. 7 illustrates the relations between the frequencies and isolations of the antenna structure of the electronic device of FIG. 1. With reference to FIG. 1 to FIG. 7, the relative distance between the two antenna assemblies 100 on the right side and left side of FIG. 1 is relatively far (greater than 250 mm), the isolations of the two antenna assemblies 100 are both less than −20 dB within the first frequency band (WiFi 2.4G, with the corresponding frequency of 2400 MHz to 2500 MHz) and at the second frequency band (WiFi 5G, with the corresponding frequency of 5150 MHz to 5875 MHz).

In view of the foregoing, in the electronic device provided by the embodiments of the invention, the housing of the first machine body is constituted by the metal upper cover and the metal casing. The metal casing includes two slits and two slots individually disposed at the two side walls. The two antenna assemblies are disposed in the first machine body close to the two sides and near the two slits and slots. The antenna pattern of each of the antenna assemblies encloses the closed zone and includes the feed end and the ground end, such that the first loop and the second loop are formed. Moreover, the orthographic projections of the antenna pattern and the enclosed closed zone on the side wall of the metal casing overlap with the slot and are close to the slit. As such, the antenna pattern may resonate with the slit and the slot to generate the first frequency band and the second frequency band, respectively, and thereby favorable performance is achieved. Comparing to the conventional electronic devices, in the electronic device provided by the embodiments of the invention, the appearance of the housing may be made of metal. Moreover, since the antenna structure is disposed at the two sides of the first machine body, the width of the external frame of the display panel on the second machine body may be reduced. In addition, the antenna assembly provided by the embodiments of the invention is attached to the supporting member and has a simple structure and relatively thin thickness, and the antenna assembly may therefore be applied to an ultra-thin machine body.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An antenna structure, comprising:
    a metal casing comprising a slit and a slot adjacent to each other, wherein a length of the slit is greater than a length of the slot, and a width of the slit is less than a width of the slot; and
    an antenna assembly located in the metal casing and near the slit and the slot, the antenna assembly comprising:
        a substrate; and
        an antenna pattern disposed on the substrate and enclosing a closed zone, the antenna pattern comprising a feed end and a ground end to form a first loop and a second loop, orthographic projections of the antenna pattern and the enclosed closed zone on the metal casing overlapping with the slot, the antenna pattern resonating with the slit and the slot to generate a first frequency band and a second frequency band respectively.

2. The antenna structure as claimed in claim 1, wherein the antenna pattern further comprises a first radiating unit and a second radiating unit, and each of the first radiating unit and the second radiating unit comprises a plurality of widths, wherein the first radiating unit comprises a first end portion and a second end portion opposite to each other in a length direction and the feed end located between the first end portion and the second end portion, the second radiating unit comprises a third end portion and a fourth end portion opposite to each other in the length direction, the first end portion is connected to the third end portion, and the second end portion is connected to the fourth end portion such that the closed zone is enclosed.

3. The antenna structure as claimed in claim 2, wherein the second radiating unit comprises a ground end corresponding to the feed end; the feed end, the first end portion, the third end portion and the ground end together form the first loop, and a bandwidth of the first frequency band is adapted to be adjusted with the widths of the first radiating unit or a length of a path of the first loop.

4. The antenna structure as claimed in claim 2, wherein the antenna pattern further comprises an extending radiating unit extending from the feed end to the first end portion, the second radiating unit comprises a ground end corresponding to the feed end; the feed end, the second end portion, the fourth end portion and the ground end together form a second loop; projections of the extending radiating unit and a portion of the antenna pattern forming the second loop on the metal casing overlap with the slot, and a bandwidth of the second frequency band is adapted to be adjusted with a length of the extending radiating unit or a length of a path of the second loop.

5. The antenna structure as claimed in claim 1, wherein the antenna assembly further comprises a ground layer disposed on the substrate and overlapping with a portion of the antenna pattern to conduct the ground end, and the ground layer is connected to the metal casing through a conduction member.

6. The antenna structure as claimed in claim 1, wherein the antenna assembly further comprises a coaxial transmission line, wherein the substrate comprises a first surface and a second surface opposite to each other and two conduction vias, the antenna pattern is disposed on the first surface, the coaxial transmission line is disposed on the second surface, and the feed end and the ground end of the antenna pattern are electrically connected to an anode and a cathode of the coaxial transmission line, respectively, through the two conduction vias.

7. An electronic device, comprising:
    a first machine body comprising:
        a metal upper cover;
        a metal casing, the metal upper cover covering the metal casing, the metal casing comprising a bottom wall and two side walls opposite to each other, wherein the two side walls comprise two slits and two slots, the two slits are individually located on the corresponding two side walls close to the metal upper cover, the two slots are individually located on the corresponding two side walls close to the bottom wall, and the slit on each of the side walls is adjacent to the slot, wherein a length of the slit is greater than a length of the slot, and a width of the slit is less than a width of the slot; and
    two antenna assemblies, individually disposed in the metal casing and near the two slits and the two slots, each of the antenna assemblies comprising:

a substrate; and an antenna pattern disposed on the substrate and enclosing a closed zone, the antenna pattern comprising a feed end and a ground end to form a first loop and a second loop, orthographic projections of the antenna pattern and the enclosed closed zone on the side wall overlapping with the slot, the antenna pattern resonating with the slit and the slot to generate a first frequency band and a second frequency band, respectively.

8. The electronic device as claimed in claim 7, wherein the two antenna assemblies further comprise two ground layers individually disposed on the two substrates and overlapping with portions of the two antenna patterns to conduct the two ground ends, the first machine body further comprises two conductive members and two metal blocking walls located between the metal casing and the metal upper cover, the two conductive members individually connect the two ground layers of the two antenna assemblies to the bottom wall, the two metal blocking walls are individually located next to the two antenna assemblies and are connected to the metal upper cover and the bottom wall such that the two antenna assemblies are individually located between the two metal blocking walls and the two side walls, and projections of the two metal blocking walls on the two side walls overlap with the two slits and the two slots.

9. The electronic device as claimed in claim 7, wherein the first machine body further comprises:

a wireless communication module disposed in the metal casing, the two antenna assemblies further comprising two coaxial transmission lines electrically connected to the wireless communication module, wherein in each of the antenna assemblies, the substrate comprises a first surface, a second surface, and two conduction vias, the antenna pattern is disposed on the first surface, the coaxial transmission line is disposed on the second surface, the feed end and the ground end of the antenna pattern are electrically connected to an anode and a cathode of the coaxial transmission line, respectively, through the two conduction vias.

10. The electronic device as claimed in claim 6, wherein the first machine body further comprises:

two supporting members disposed in the metal casing, curves of the two supporting members corresponding to curves of the two side walls, the two substrates of the two antenna assemblies being two flexible substrates individually attached on the two supporting members, and the two antenna patterns facing the two side walls.

11. The electronic device as claimed in claim 1, further comprising a second machine body pivoted to one side of the first machine body to rotate with respect to the first machine body.

* * * * *